US008013253B2

(12) United States Patent
Bormann et al.

(10) Patent No.: US 8,013,253 B2
(45) Date of Patent: Sep. 6, 2011

(54) ELECTRICAL CONNECTION BOARD AND ASSEMBLY OF SUCH A BOARD AND A SEMICONDUCTOR COMPONENT COMPRISING AN INTEGRATED CIRCUIT CHIP

(75) Inventors: Pierre Bormann, Tullins (FR); Luc Morineau, Crolles (FR); Jacques Chavade, Moirans (FR)

(73) Assignee: STMicroelectronics S.A., Montrouge (FR)

( * ) Notice: Subject to any disclaimer, the term of this patent is extended or adjusted under 35 U.S.C. 154(b) by 824 days.

(21) Appl. No.: 12/062,580

(22) Filed: Apr. 4, 2008

(65) Prior Publication Data
US 2008/0261415 A1 Oct. 23, 2008

(30) Foreign Application Priority Data
Apr. 4, 2007 (FR) ..................... 07 54261

(51) Int. Cl.
H05K 1/00 (2006.01)
H05K 1/11 (2006.01)
(52) U.S. Cl. ......... 174/250; 174/255; 174/261; 361/777
(58) Field of Classification Search .......... None
See application file for complete search history.

(56) References Cited

U.S. PATENT DOCUMENTS

| 6,194,668 | B1 * | 2/2001 | Horiuchi et al. | 174/261 |
|---|---|---|---|---|
| 6,229,099 | B1 * | 5/2001 | Horiuchi et al. | 174/261 |
| 6,335,493 | B1 * | 1/2002 | Horiuchi et al. | 174/261 |
| 6,407,344 | B1 * | 6/2002 | Horiuchi et al. | 174/261 |
| 6,452,115 | B2 * | 9/2002 | Horiuchi et al. | 174/261 |
| 6,664,483 | B2 * | 12/2003 | Chong et al. | 174/261 |
| 6,762,366 | B1 * | 7/2004 | Miller et al. | 174/250 |
| 6,803,664 | B2 * | 10/2004 | Murayama | 257/779 |
| 6,835,597 | B2 * | 12/2004 | Murayama | 438/108 |
| 7,368,667 | B2 * | 5/2008 | Brown | 174/262 |
| 7,838,778 | B1 * | 11/2010 | Hasko et al. | 174/262 |
| 7,871,831 | B1 * | 1/2011 | Yao et al. | 438/14 |

FOREIGN PATENT DOCUMENTS
EP   1 075 026 A2   2/2001

OTHER PUBLICATIONS
French Search Report, FA 693388, Sep. 13, 2007, 2 Pages.
* cited by examiner Primary Examiner — Boris Chervinsky
(74) Attorney, Agent, or Firm — Gardere Wynne Sewell LLP

(57) ABSTRACT

An electrical connection board includes electrical connection terminals on one face with a view toward connecting with a semiconductor component and electrical connection tracks connected respectively to these terminals. The terminals are arranged in a square matrix having two orthogonal directions. On its face, the board includes a multiplicity of identical adjacent connection groups, each group having N adjacent terminals and N tracks placed along this direction while extending towards an edge of the matrix. The terminals of a group are offset by one pitch relative to the terminals of an adjacent group. The board and a semiconductor component are connected together by electrical connection balls.

19 Claims, 5 Drawing Sheets

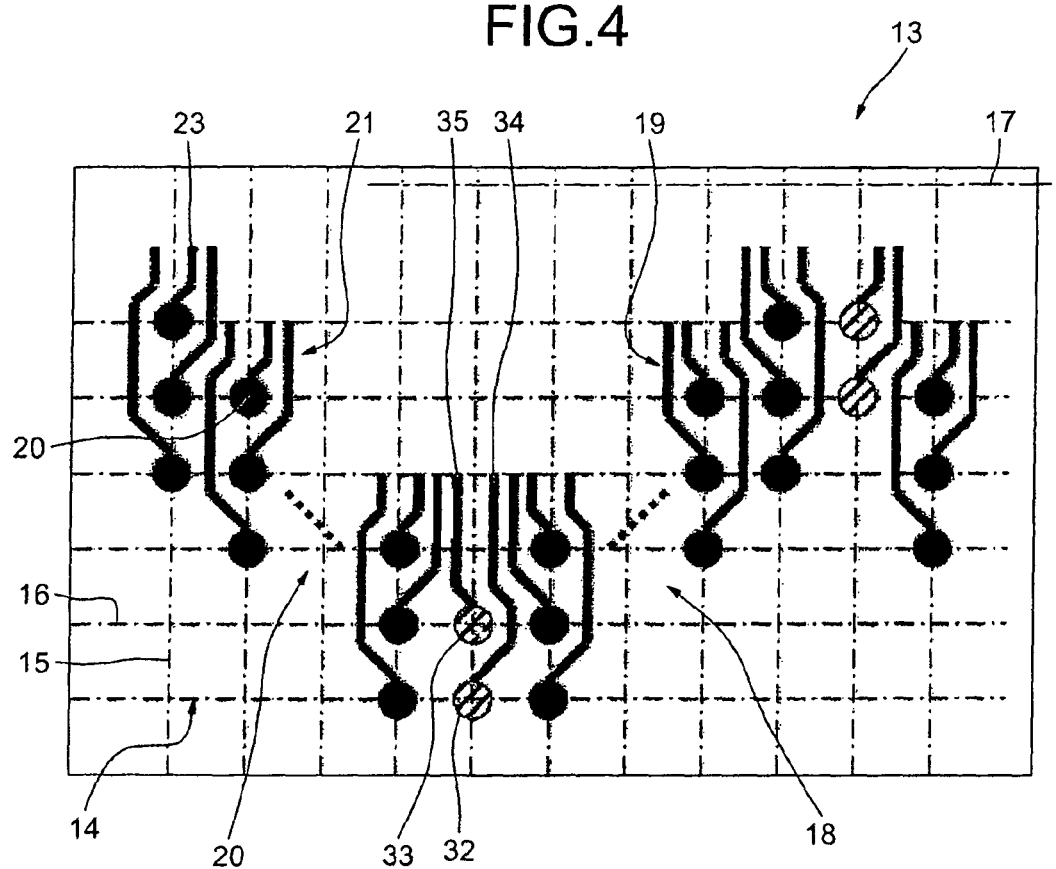

ELECTRICAL CONNECTION BOARD AND ASSEMBLY OF SUCH A BOARD AND A SEMICONDUCTOR COMPONENT COMPRISING AN INTEGRATED CIRCUIT CHIP

PRIORITY CLAIM

The present application is a translation of and claims priority from French Application for Patent No. 07 54261 of the same title filed Apr. 4, 2007, the disclosure of which is hereby incorporated by reference.

BACKGROUND OF THE INVENTION

1. Technical Field of the Invention

The present invention relates to the field of the mounting semiconductor components, containing one or more integrated circuit chips, on an electrical connection board with a view toward connecting this component to other electronic components also mounted on the same electrical connection board.

2. Description of Related Art

In general, it is known to mount a semiconductor component on an electrical connection board by means of electrical connection balls which connect electrical connection terminals provided on one face of the semiconductor component and electrical connection terminals of the board. The electrical connection balls, and consequently the electrical connection terminals of the semiconductor component and those of the board, are generally distributed in a square matrix, the adjacent balls of the rows of balls all being aligned parallel to the flanks (or edges) of the semiconductor component and being adjacent.

Conventionally, rows of balls distributed over the periphery of the face of the semiconductor component are provided, and in certain cases rows at the center of this face, which are spaced apart relative to the peripheral terminals. In other cases, balls are provided over the entire face of the semiconductor component.

In order to carry out the routing, i.e. the connection of the terminals of the board to other components carried by the board, there are several known solutions. The first solution consists in producing electrical connection tracks on the face of the board, in which case the tracks reaching the terminals of the rows located behind (or on the interior of) the lateral rows need to pass between the terminals of these lateral rows. Another solution, often employed together with the first, consists in providing electrical connection vias formed between the terminals in order to join tracks produced at depth in a multilayered board.

The production of tracks passing between the terminals is technologically contingent on the size of the pitch of the matrix of balls, the size of the balls and the width of the tracks. Where appropriate, one must take into account perturbing electromagnetic effects which necessitate a minimum distance between the terminals and the tracks and between the adjacent tracks.

Production of multilayered boards and electrical connection vias requires the use of specific fabrication means, which are relatively expensive.

SUMMARY OF THE INVENTION

According to one aspect, an electrical connection board is provided which is better suited to the technological fabrication conditions and the need to the reduce fabrication costs.

According to another aspect, an electrical connection board is provided which, in certain cases, does not require the production of electrical connection vias and the production of boards having more than two layers.

Another aspect provides an electrical connection board which tends to reduce the size of the pitch of a matrix of balls and consequently to reduce the dimensions of the semiconductor components.

According to another aspect, for certain applications, a particular layout of the electrical connection terminals on the board is provided, associated with a particular layout of the electrical connection tracks connected to these terminals.

According to one embodiment, an electrical connection board is provided which comprises electrical connection terminals on one face with a view to connecting to a semiconductor component and electrical connection tracks connected respectively to these terminals, these terminals being arranged in a square matrix having two orthogonal directions.

According to a general characteristic, the board comprises a multiplicity of identical adjacent connection groups on the face.

Each connection group comprises N adjacent terminals placed along a first direction of the matrix and N tracks placed along this direction while extending towards an edge of the matrix.

The N tracks comprise a central track connected to an end terminal located on the side of the edge of the matrix and lateral tracks arranged so that, when the number of terminals N is equal to an odd number, the number of lateral tracks passing on each side of the end terminal is equal to one-half of the number of terminals N minus one ((N−1)/2), and, when the number of terminals N is equal to an even number, the number of lateral tracks passing on one side of the end terminal is equal to one-half (N/2) the number of tracks N and the number of lateral tracks passing on the other side of this said end terminal is equal to one-half the number of terminals N minus one ((N−1)/2).

The terminals of a group are offset by one pitch relative to the terminals of the adjacent group along each direction of the matrix.

The offset along the first direction is such that a number of lateral tracks equal to the number of terminals N minus one (N−1) pass between the end terminals located on the side of the edge of the matrix and a number of lateral tracks equal to the number of terminals N minus two (N−2) pass between the end terminal of one group and the second terminal of the other group, which are adjacent along the second direction of the matrix.

According to one embodiment, each group comprises three adjacent terminals and three tracks, namely a central track connected to a first terminal and two lateral tracks passing on either side of the first terminal and connected respectively to a second and a third terminal, the offset along the first direction being such that two lateral tracks pass between the end terminals located on the side of the edge of the matrix and one lateral track passes between the end terminal of one group and the second terminal of the other group, which are adjacent along the second direction of the matrix.

According to another embodiment, each group comprises four adjacent terminals and four tracks, namely a central track connected to a first terminal, one lateral track passing on one side of and next to the first terminal and two lateral tracks passing on either side of the first terminal and connected respectively to a third and a fourth terminal, the offset along the first direction being such that three lateral tracks pass between the end terminals located on the side of the edge of the matrix and two lateral tracks pass between the end terminal of one group and the second terminal of the other group, which are adjacent along the second direction of the matrix.

According to another embodiment, each group comprises five adjacent terminals and five tracks, namely a central track connected to a first terminal, two lateral tracks passing on either side of and next to the first terminal and connected respectively to a second and a third terminal and two lateral tracks passing on either side of the first, the second and the third terminals and connected respectively to a fourth and a fifth terminal, the offset along the first direction being such that four lateral tracks pass between the end terminals located on the side of the edge of the matrix and three lateral tracks pass between the end terminal of one group and the second terminal of the other group, which are adjacent along the second direction of the matrix.

In an embodiment, an assembly of a semiconductor component has electrical connection terminals on one face and an electrical connection board as defined above, the electrical connection terminals of the semiconductor component being connected to the electrical connection terminals of the board by means of electrical connection balls.

In an embodiment, an electrical connection board comprises: a plurality of electrical connection terminals on one face of the board for connection to a semiconductor component, wherein the terminals are positioned at selected intersection points in a matrix having two orthogonal directions and a plurality of electrical connection tracks connected respectively to these terminals. The electrical connection terminals are divided into a plurality of connection groups, each connection group including N adjacent terminals aligned along a first one of the orthogonal directions which is perpendicular to an edge of the board. N electrical connection tracks connect to the N adjacent terminals and extend parallel to the first orthogonal direction towards the edge of the board. A first of the connection groups is diagonally offset from a second of the connection groups by one intersection point in both of the two orthogonal directions.

BRIEF DESCRIPTION OF THE DRAWINGS

The present invention will be understood more clearly by studying electrical connection boards provided with various electrical connection devices, described by way of non-limiting examples and illustrated by the appended drawing, in which:

FIG. 4 represents a front view of the board, provided with the first layout;

DETAILED DESCRIPTION OF THE DRAWINGS

Figure 1:
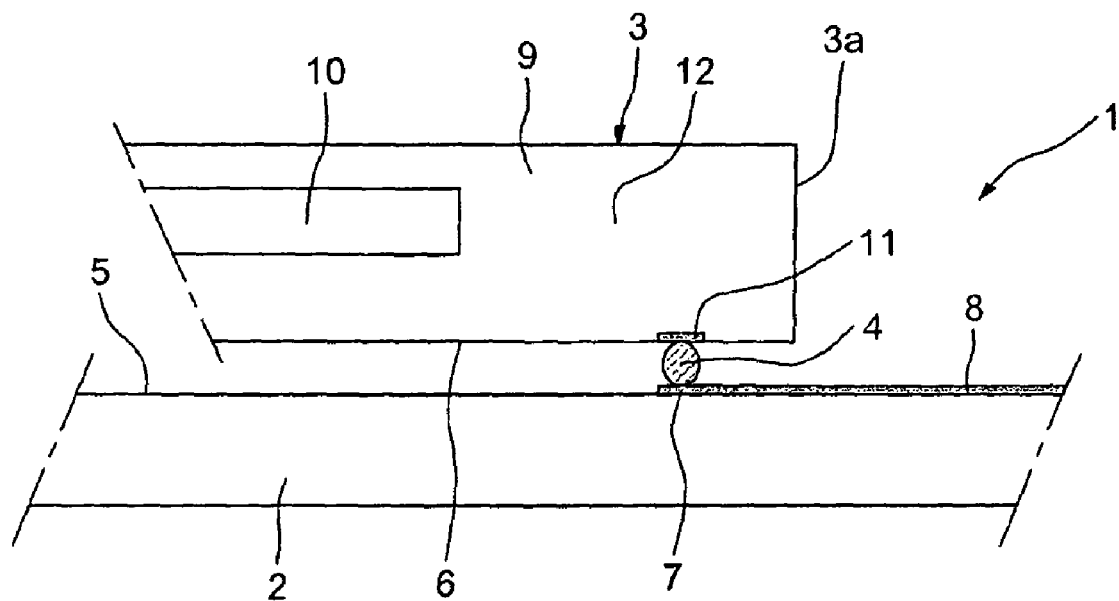
FIG. 1 represents a general view in section of an assembly comprising an electrical connection board.

Referring to FIG. 1, it can be seen that an assembly 1 has been represented comprising an electrical connection board 2, a semiconductor component 3 and a multiplicity of electrical connection balls 4 which are installed in a space separating one face 5 of the board and one face 6 of the semiconductor component 3, these faces 5 and 6 extending parallel to one another and being located at a distance from one another.

On its face 5, the board 2 has a multiplicity of electrical connection terminals 7 onto which the electrical connection balls 4 are respectively soldered, and a multiplicity of electrical connection tracks 8 which do not intersect, are respectively connected to the electrical connection terminals 7 and make it possible to connect the component 3 electrically to other electronic components carried by the board 2.

According to one variant, the semiconductor component 3 comprises a package 9 in which an integrated circuit chip 10 is inserted. The face 6 of the semiconductor component 3 has a multiplicity of electrical connection terminals 11, onto which the electrical connection balls 4 are respectively soldered, these terminals 11 being electrically connected to the integrated circuit chip 10 by electrical connection lines or wires 12 included in the package 9.

The electrical connection balls 4 are used at the same time for mechanical connection between the board 2 and the component 3.

Figure 2:
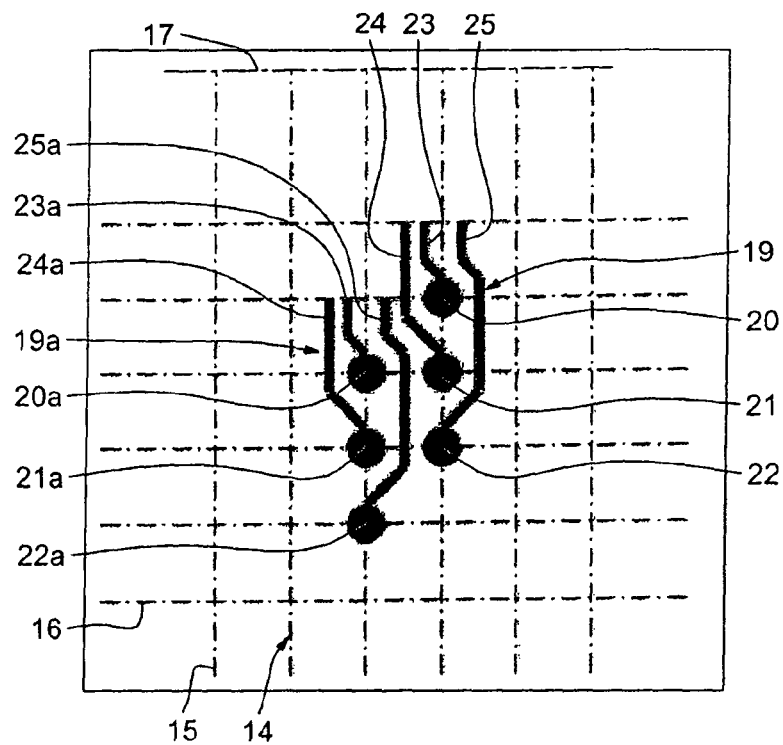
FIG. 2 represents a front view of the board, provided with first elementary connection groups of a first layout.
Figure 3:
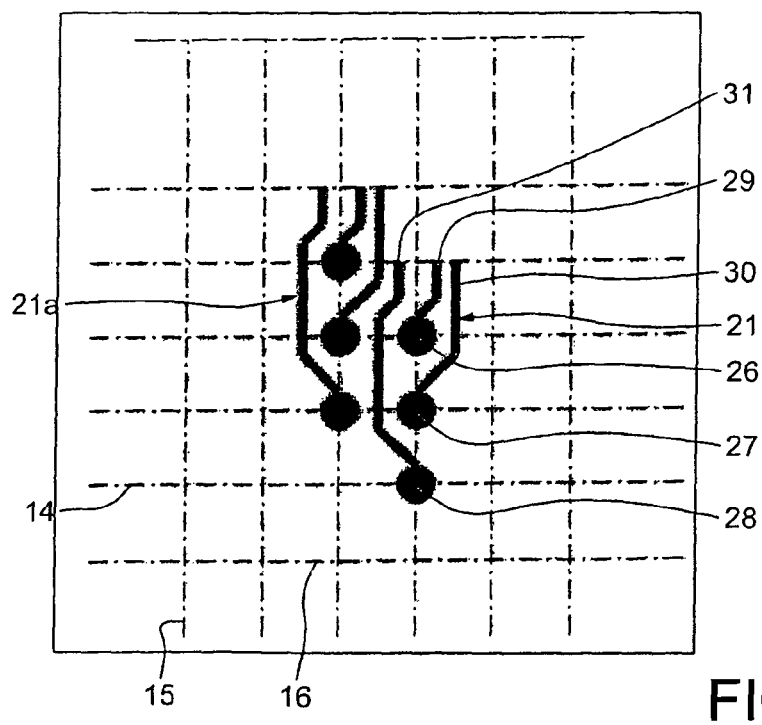
FIG. 3 represents a front view of the board, provided with second elementary connection groups of the first layout.

Referring to FIGS. 2, 3 and 4, a first layout 13 of electrical connection terminals and electrical connection tracks on the face 5 of the electrical connection board 2 will now be described, and consequently a first layout of electrical connection balls and terminals on the face 6 of the semiconductor component 3.

The first layout 13 is formed so that the corresponding terminals of the face 6 of the semiconductor component 3 lie on the periphery of this face 6.

The electrical connection terminals of this first layout 13 are formed on certain geometrical intersections of a square matrix 14 having two orthogonal directions 15 and 16, which are parallel to the flanks of the semiconductor component 3. This matrix has an edge or side 17 parallel to a flank 3a of this component 3 and located on the side of this flank, so that the direction 15 extends perpendicularly to the edge 17 and the direction 16 extends parallel to this edge 17.

The first layout 13 comprises a first arrangement 18 of a plurality of identical adjacent first elementary groups 19 and a second arrangement 20 of a plurality of second identical adjacent elementary groups 21'.

As shown by FIG. 2, each first electrical connection group 19 comprises three adjacent electrical connection terminals which are placed along the direction 15 of the matrix 14, namely a first end terminal 20 located on the side of the edge 17 of the matrix 14, a second terminal 21 and a third terminal 22, as well as three electrical connection tracks, namely a central track 23 and two lateral tracks 24 and 25, these tracks extending substantially parallel to the direction 15 of the matrix 14, in the direction of the edge 17 of this matrix 14.

The central track 23 is connected to the end terminal 20. The lateral track 24 passes beside the end terminal 20, on its left while extending towards the edge 17 of the matrix 14, and it joins the second terminal 21 while being inclined. The lateral track 24 passes beside the end terminal 20 and the second terminal 21, on the right of them while extending towards the edge 17 of the matrix 14, and it joins the third terminal 22 while being inclined.

As shown by FIG. 2, two adjacent first elementary groups 19 and 19a of a first arrangement 18 are disposed so that the terminals 20a, 21a and 22a of the group 14a are offset by one pitch along the direction 15 of the matrix 14 and by one pitch along the direction 16 of this matrix 14. The groups 19 and 19a are then offset diagonally by one pitch.

Assuming that the group 19a is offset by one pitch along the direction 16, on the left of the group 19 while extending towards the edge 17 of the matrix 14, the group 19a is separated by one pitch from the edge 17 of the matrix 14 relative to the group 19. This is represented in FIG. 2.

This results in the following configuration.

The terminals 20a, 21a and 22a of the group 19a are separated by one pitch from the edge 17 of the matrix 14 relative to the terminals 20, 21 and 22 of the group 19.

The track 25a of the group 19a passes between the track 24 of the group 19, the tracks 24 of the groups 19 and 19a thus passing between the end terminals 20 and 20a of the groups 19 and 19a.

The track 25a of the group 19a passes between the second terminal of the group 19 and the end terminal 20 of the group 19a and between the third terminal 22 of the group 19 and the second terminal 21a of the group 19a.

By successively adopting the aforementioned offset, an arrangement 18 of N identical and adjacent electrical connection groups 19 can be formed. The corresponding terminals are arranged in an aligned fashion along adjacent diagonals of the matrix 14.

It can be seen in FIG. 4 that an arrangement 18 of four identical adjacent first electrical connection groups 19 has been provided on the face 5 of the board 2. Such an arrangement is disposed on four adjacent directions 15 and on six adjacent directions 16.

The result of this is that only a single track passes between two terminals which are adjacent along the direction 16, and only two tracks pass between two adjacent first end terminals lying on a diagonal of the matrix 14, these two tracks presenting a diagonal portion of the matrix 14 at this position.

Referring to FIG. 3, it can be seen that each second electrical connection group 21' comprises three adjacent electrical connection terminals 26, 27 and 28, placed along a direction 15 of the matrix 14, as well as three electrical connection tracks 29, 30 and 31 extending substantially parallel to the direction 15 of the matrix 14, in the direction of the edge 17 of this matrix 14.

The layout of the tracks 29, 30 and 31 of the second group 21' is symmetrical with the tracks 23, 24 and 25 of the group 19, with respect to the direction 15 of the matrix 14.

The offset of a second group 21a' adjacent to the group 21' is also symmetrical with respect to the offset described in conjunction with the adjacent groups 19 and 19a.

By successively adopting this symmetrical offset, it is possible to form an arrangement 20 of N identical and adjacent electrical connection groups 21' whose corresponding terminals are arranged along adjacent diagonals of the matrix 14, symmetrical with respect to a direction 15 of the matrix 14, the diagonals of an arrangement 18 extending perpendicularly to the diagonals of an arrangement 20.

FIG. 4 represents an arrangement 20 of four second identical adjacent electrical connection groups 19. As before, such an arrangement is disposed on four adjacent directions 15 and on six adjacent directions 16.

It can also be seen in FIG. 4 that an arrangement 20 of four identical adjacent electrical connection groups 21' has been provided on the face 5 of the board 2. Such an arrangement is disposed on four adjacent directions 15 and on six adjacent directions 16.

Advantageously, as shown by FIG. 3, an arrangement 18 and an arrangement 20 may be associated so that their corresponding terminals are arranged on the same directions 16 of the matrix 14, while having end groups lying opposite along the direction 16 and offset by two pitches along this direction 16. Two arrangements 18 and 20 disposed in this way form either a V-shape which is open on the side of the edge 17 of the matrix 14, or a V-shape which is open on the opposite side.

The direction 15 of the matrix 14, passing between the arrangements 18 and 20, may advantageously have two filling terminals 32 and 33 placed either between the second and third terminals of the end groups when the V-shape is open on the side of the edge 17 of the matrix 14, or between the first and second terminals of the end groups when the V-shape is open on the other side from the edge 17 of the matrix 14, as well as two tracks 34 and 35 connected to these terminals 32 and 33.

Arrangements 18 and 20 may advantageously be distributed in correspondence with the four flanks of the semiconductor component 3. The points of the matrix 14 which lie between the outer ends of two adjacent arrangements in the region of the corners of the semiconductor component 3 may furthermore have filling terminals connected to tracks on the face 5 of the board 2.

Figure 6:
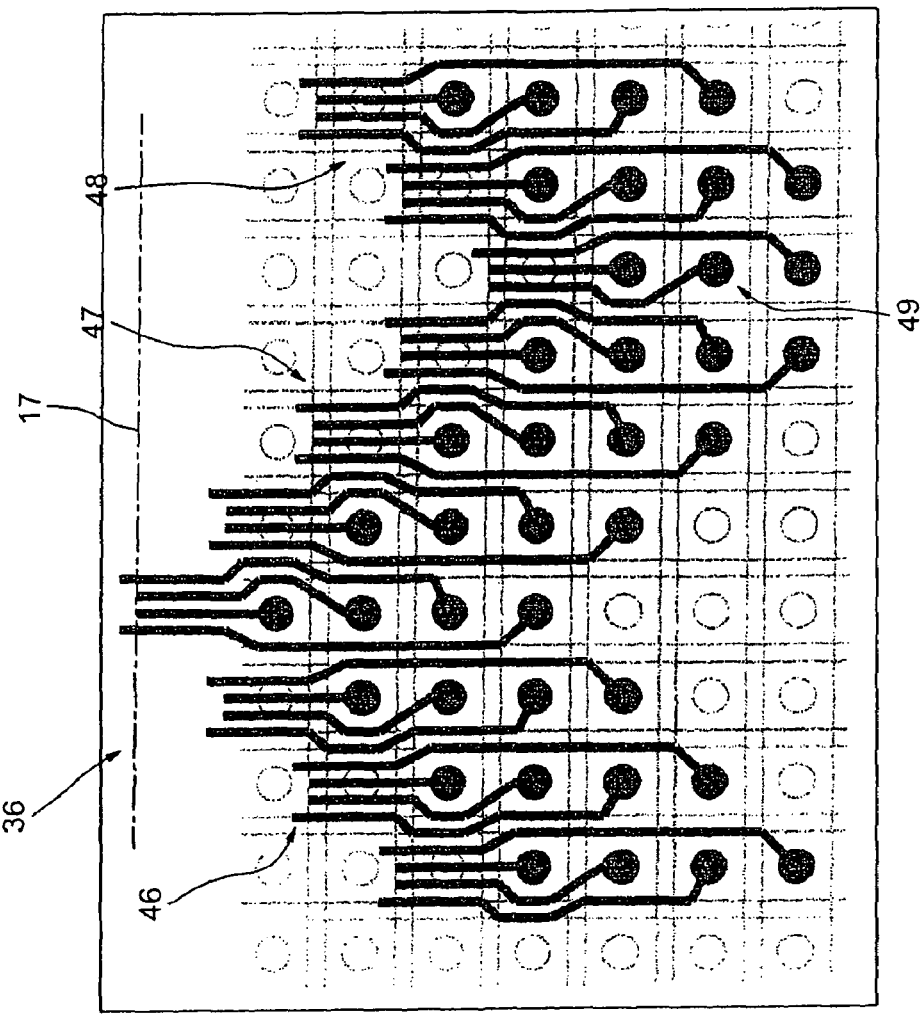
FIG. 6 represents a front view of the board, provided with the second layout.
Figure 5:
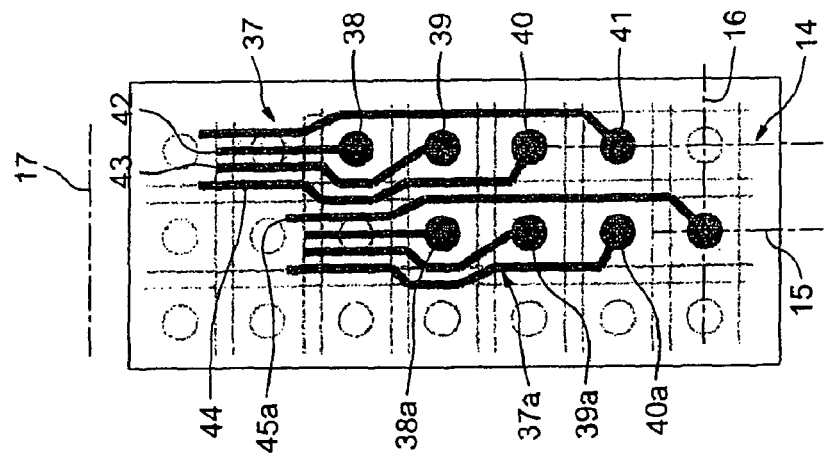
FIG. 5 represents a front view of the board, provided with first elementary connection groups of a second layout.

Referring to FIGS. 5 and 6, a second layout 36 will now be described with reference to the matrix 14, its directions 15 and 16 and its edge or side 17.

This second layout 36 differs from the first layout 13 in that its elementary connection groups 37 comprise four adjacent and aligned electrical connection terminals placed along the direction 15 of the matrix 14, namely a first end terminal 38 located on the side of the edge 17 of the matrix 14, a second terminal 39, a third terminal 40 and a fourth terminal 41.

This second layout 36 also differs from the first layout 13 in that each group 37 has four electrical connection tracks, namely a central track 42 connected to the first end terminal 38, one lateral track 43 passing on one side of this first terminal 38 and extending as far as the second terminal 39, and two lateral tracks 44 and 45 passing on either side of the first and second terminals 38 and 39 and likewise extending respectively as far as the third and fourth terminals 40 and 41. Furthermore, the lateral track 43 passes between the first terminal 38 and the lateral track 44.

As before, electrical connection groups 37 may be placed adjacently while being successively offset by one pitch along the direction 15 and the direction 16 of the matrix 14, so as to constitute arrangements 46 or 47 whose groups are symmetrical with respect to the direction 15 of the matrix 14.

According to this variant, as shown in particular by FIG. 5, these arrangements are such that the track 44 of a group 45 is adjacent to the track 45a of an adjacent group 37a, this group 37a being offset by one pitch along the direction 15 of the matrix, separating it from the edge 17 of this matrix.

This results in the following configuration.

Three tracks pass between the first end terminals 38 and 38a of two adjacent groups 37 and 37a, i.e. the tracks 43 and 44 of a group 37 and the track 45a of an adjacent group 37a.

Two tracks pass between the second terminal 39 of a group 37 and the first end terminal of an adjacent group 37a, namely the track 44 of the group 37 and the track 45a of the adjacent group 37a.

The track 45a of the adjacent group 37a passes between the third terminal 40 of a group 37 and the second terminal 39a of an adjacent group 37a, this track also passing between the fourth terminal 41 of a group 37 and the third terminal 39a of an adjacent group 37a.

As with respect to the layout 13, the layout 36 may comprise adjacent arrangements 46 and 47 forming V-shapes which are open on the opposite side of this edge 17 of the matrix 14, or adjacent arrangements 47 and 48 forming V-shapes which are open on the side of the edge 17.

Advantageously, the arrangements 47 and 48 are separated by two pitches along the direction 16 of the matrix 14. A particular group 49 of three adjacent terminals and three tracks may be placed on the direction 16 separating these arrangements 47 and 48.

Figure 8:
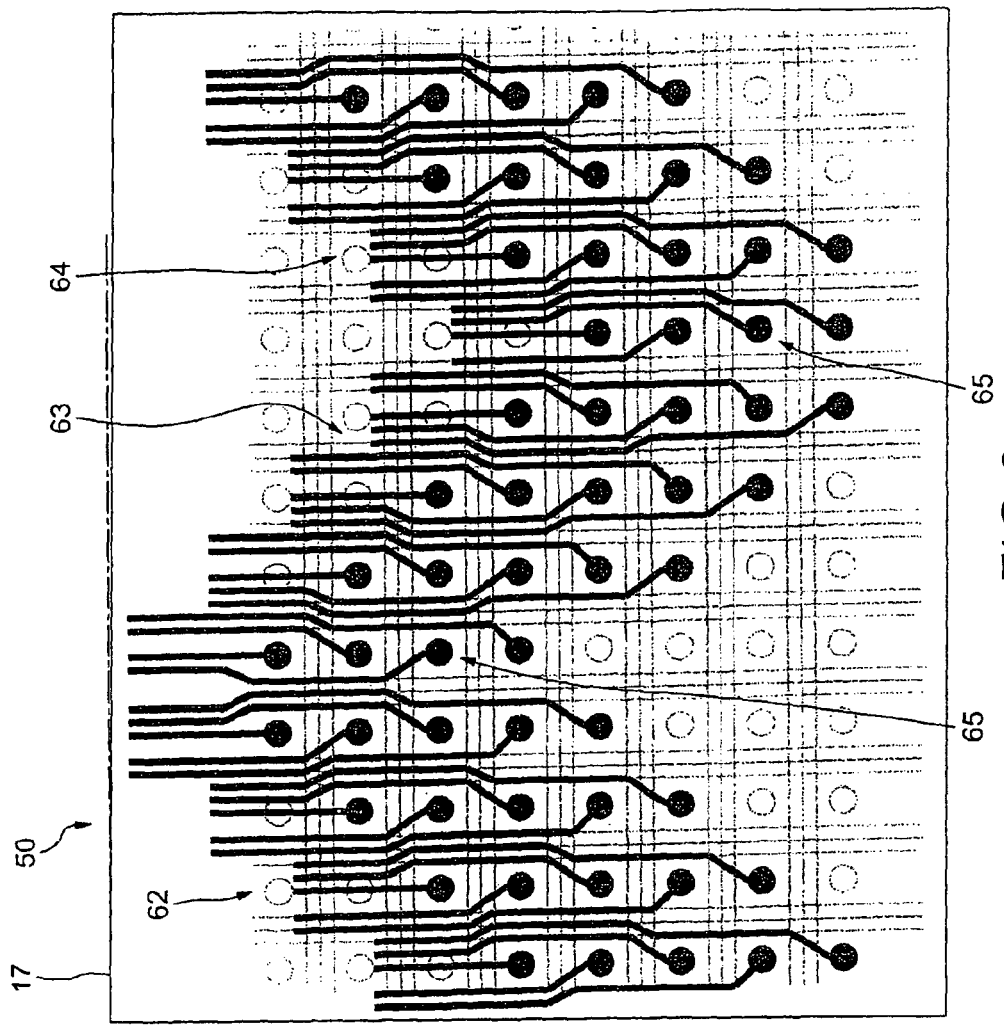
FIG. 8 represents a front view of the board, provided with the third layout.
Figure 7:
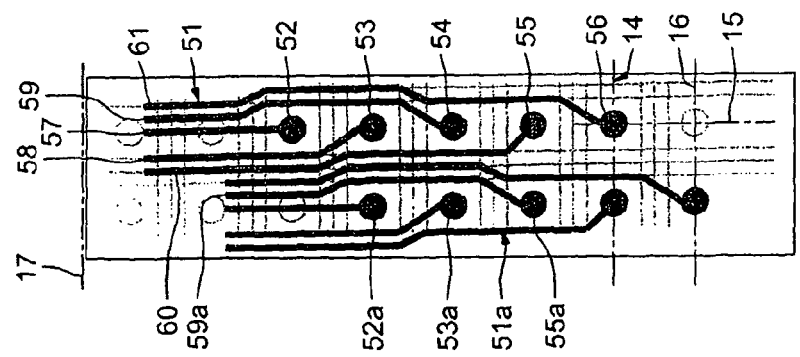
FIG. 7 represents a front view of the board, provided with first elementary connection groups of a third layout.

Referring to FIGS. 7 and 8, a third layout 50 will now be described with reference to the matrix 14, its directions 15 and 16 and its edge or side 17.

This third layout 50 differs from the previous layouts in that its elementary electrical connection groups 51 comprise five adjacent and aligned electrical connection terminals placed along the direction 15 of the matrix 14, namely a first end terminal 52 located on the side of the edge 17 of the matrix 14, a second terminal 53, a third terminal 54, a fourth terminal 55 and a fifth terminal 56.

This third layout 50 also differs from the previous layouts in that each group 50 has five electrical connection tracks, namely a central track 57 connected to the first end terminal 52, one lateral track 58 passing on one side of this first terminal 52 and extending as far as the second terminal 53, one lateral track 59 passing on the other side of the first terminal 52 and extending respectively as far as the third terminal 54, while passing beside the second terminal 53, and two lateral tracks 60 and 61 passing on either side of the first, second and third terminals 52, 53 and 54 and likewise extending respectively as far as the fourth and fifth terminals 55 and 56. Furthermore, the lateral track 58 passes between the first terminal 38 and the lateral track 60, and the lateral track 59 passes between the first and second terminals 52 and 53 and the lateral track 61.

As before, electrical connection groups 51 may be placed adjacently while being successively offset by one pitch along the direction 15 and the direction 16 of the matrix 14, so as to constitute arrangements 62 or 63 whose groups are symmetrical with respect to the direction 15 of the matrix 14.

As shown in particular by FIG. 5, these arrangements are such that the track 60 of a group 51 is adjacent to the track 61a of an adjacent group 51a, this group 51a being offset by one pitch along the direction 15 of the matrix, separating it from the edge 17 of this matrix.

This results in the following configuration.

Four tracks pass between the first end terminals 52 and 52a of two adjacent groups 51 and 51a, i.e. the tracks 57 and 58 of a group 51 and the tracks 59a and 61a of an adjacent group 51a.

Three tracks pass between the second terminal 53 of a group and the first end terminal 52a of an adjacent group 51a, i.e. the track 60 of the group 51 and the tracks 59a and 61a of the adjacent group 51a.

The tracks 59a, 60 and 61a again pass between the third terminal 54 of a group 51 and the second terminal 53a of an adjacent group 51a.

The track 61a of the group 51a passes between the fourth terminal 55 of a group 51 and the third terminal 54a of an adjacent terminal 51a, the track 61a also passing between the fifth terminal 56 of a group 51 and the fourth terminal 55a of an adjacent group 51a.

As with respect to the previous layouts, the layout 50 may comprise adjacent arrangements 62 and 63 forming V-shapes which are open on the opposite side of this edge 17 of the matrix 14, or adjacent arrangements 63 and 64 forming V-shapes which are open on the side of the edge 17.

Advantageously, the arrangements 62 and 63 and the arrangements 63 and 64 are separated by two pitches along the direction 16 of the matrix 14. Particular groups 65 of four adjacent terminals and four tracks may be placed on the directions 16 separating the arrangements 47 and 48 and the arrangements 63 and 64.

Generally, in the examples which have just been described, the distances between the various tracks and between them and the terminals are preferably substantially equal, the design of the tracks being optimally produced in order to obtain equal distances by imparting direction changes to them.

The layouts which have just been described are selected as a function of the desired number of electrical connections of the semiconductor component 3 with other electrical components mounted on the board 2, without any other electrical connection means. Electrical connections may nevertheless be provided in the central part of the semiconductor component 3 by means of electrical connection balls, these connections comprising electrical connection vias formed in the board 2 and reaching either tracks formed on the opposite face of the board 2 from its face 5 or tracks integrated into this board.

Electrical connection terminals optionally adjacent to the aforementioned internal terminals could of course be added, which might be connected to electrical connection tracks formed at depth in a multilayered board with two layers, three layers or more than three layers.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electrical connection board comprising:
   a plurality of electrical connection terminals on one face of the board for connection to a semiconductor component, wherein the terminals are generally arranged in a matrix having two orthogonal directions;
   a plurality of electrical connection tracks connected respectively to these terminals;
   wherein the electrical connection terminals are divided into a multiplicity of identical adjacent connection groups possessing the following characteristics:
      each group comprises N adjacent terminals placed along a first direction of the matrix and N tracks extending along said first direction towards an edge of the matrix;
      the N tracks comprise a central track connected to an end terminal on a side towards the edge of the matrix and plural lateral tracks arranged so that, when the number of terminals N is equal to an odd number, the number of lateral tracks passing on each side of the end terminal is equal to one-half of the number of terminals N minus one ((N−1)/2), and, when the number of terminals N is equal to an even number, the number of lateral tracks passing on one side of the end terminal is equal to one-half the number of tracks N (N/2) and the number of lateral tracks passing on the other side of this said end terminal is equal to one-half of the number of terminals N minus one ((N−1)/2);
      the terminals of a first group are offset by one pitch relative to the terminals of an adjacent second group along each direction of the matrix; and
      an offset along said first direction is such that a number of lateral tracks equal to the number of terminals N minus one (N−1) pass between the end terminals located on the side of the edge of the matrix and a number of lateral tracks equal to the number of terminals N minus two (N−2) pass between the end terminal of one group and the second terminal of the other group, which are adjacent along the second direction of the matrix.

2. The electrical connection board according to claim 1, wherein N=3 such that:

the central track is connected to a first terminal and two lateral tracks passing on either side of the first terminal are connected respectively to a second and a third terminal; and the offset along the first direction is such that the two lateral tracks pass between the end terminals located on the side of the edge of the matrix and one lateral track passes between the end terminal of one group and the second terminal of the other group, which are adjacent along the second direction of the matrix.

3. The electrical connection board according to claim 1, wherein N=4 such that:

the central track is connected to a first terminal, one lateral track passing on one side of and next to the first terminal is connected to a second terminal, and two other lateral tracks passing on either side of the first terminal are connected respectively to a third and a fourth terminal; and the offset along the first direction is such that three lateral tracks pass between the end terminals located on the side of the edge of the matrix and two lateral tracks pass between the end terminal of one group and the second terminal of the other group, which are adjacent along the second direction of the matrix.

4. The electrical connection board according to claim 1, wherein N=5 such that:

the central track is connected to a first terminal, two first lateral tracks passing on either side of and next to the first terminal are connected respectively to a second and a third terminal, and two second lateral tracks passing on either side of the first, the second and the third terminals are connected respectively to a fourth and a fifth terminal; and the offset along the first direction is such that four lateral tracks pass between the end terminals located on the side of the edge of the matrix and three lateral tracks pass between the end terminal of one group and the second terminal of the other group, which are adjacent along the second direction of the matrix.

5. An assembly comprising:

a semiconductor component having electrical connection terminals on one face; and a board, comprising:

a plurality of electrical connection terminals on one face of the board for connection to the semiconductor component, wherein the terminals are generally arranged in a matrix having two orthogonal directions;

a plurality of electrical connection tracks connected respectively to these terminals;

wherein the electrical connection terminals are divided into a multiplicity of identical adjacent connection groups possessing the following characteristics:

each group comprises N adjacent terminals placed along a first direction of the matrix and N tracks extending along said first direction towards an edge of the matrix;

the N tracks comprise a central track connected to an end terminal on a side towards the edge of the matrix and plural lateral tracks arranged so that, when the number of terminals N is equal to an odd number, the number of lateral tracks passing on each side of the end terminal is equal to one-half of the number of terminals N minus one ((N−1)/2), and, when the number of terminals N is equal to an even number, the number of lateral tracks passing on one side of the end terminal is equal to one-half the number of tracks N (N/2) and the number of lateral tracks passing on the other side of this said end terminal is equal to one-half of the number of terminals N minus one ((N−1)/2);

the terminals of a first group are offset by one pitch relative to the terminals of an adjacent second group along each direction of the matrix; and an offset along said first direction is such that a number of lateral tracks equal to the number of terminals N minus one (N−1) pass between the end terminals located on the side of the edge of the matrix and a number of lateral tracks equal to the number of terminals N minus two (N−2) pass between the end terminal of one group and the second terminal of the other group, which are adjacent along a second direction of the matrix;

wherein the electrical connection terminals of the semiconductor component are connected to the electrical connection terminals of the board by use of electrical connection balls.

6. An electrical connection board comprising:

a plurality of electrical connection terminals on one face of the board for connection to a semiconductor component, wherein the terminals are generally arranged in a matrix having two orthogonal directions;

a plurality of electrical connection tracks connected respectively to these terminals;

wherein the electrical connection terminals are divided into a multiplicity of connection groups possessing the following characteristics:

each group comprises N adjacent terminals placed along a first direction of the matrix and N tracks extending along said first direction towards an edge of the matrix;

the N tracks comprise a central track connected to an end terminal on a side towards the edge of the matrix and plural lateral tracks arranged so that, when the number of terminals N is equal to an odd number, the number of lateral tracks passing on each side of the end terminal is equal to one-half of the number of terminals N minus one ((N−1)/2);

the terminals of a first group are offset by one pitch relative to the terminals of an adjacent second group along each direction of the matrix; and an offset along said first direction is such that a number of lateral tracks equal to the number of terminals N minus one (N−1) pass between the end terminals located on the side of the edge of the matrix and a number of lateral tracks equal to the number of terminals N minus two (N−2) pass between the end terminal of one group and the second terminal of the other group, which are adjacent along a second direction of the matrix.

7. The electrical connection board according to claim 6, wherein N=3 such that:

the central track is connected to a first terminal and two lateral tracks passing on either side of the first terminal are connected respectively to a second and a third terminal; and the offset along the first direction is such that two lateral tracks pass between the end terminals located on the side of the edge of the matrix and one lateral track passes between the end terminal of one group and the second terminal of the other group, which are adjacent along the second direction of the matrix.

8. The electrical connection board according to claim 6, wherein N=5 such that:
the central track is connected to a first terminal, two first lateral tracks passing on either side of and next to the first terminal are connected respectively to a second and a third terminal, and two second lateral tracks passing on either side of the first, the second and the third terminals are connected respectively to a fourth and a fifth terminal; and
the offset along the first direction is such that four lateral tracks pass between the end terminals located on the side of the edge of the matrix and three lateral tracks pass between the end terminal of one group and the second terminal of the other group, which are adjacent along the second direction of the matrix.

9. An electrical connection board comprising:
a plurality of electrical connection terminals on one face of the board for connection to a semiconductor component, wherein the terminals are generally arranged in a matrix having two orthogonal directions;
a plurality of electrical connection tracks connected respectively to these terminals;
wherein the electrical connection terminals are divided into a multiplicity of connection groups possessing the following characteristics:
each group comprises N adjacent terminals placed along a first direction of the matrix and N tracks extending along said first direction towards an edge of the matrix;
the N tracks comprise a central track connected to an end terminal on a side towards the edge of the matrix and plural lateral tracks arranged so that, when the number of terminals N is equal to an even number, the number of lateral tracks passing on one side of the end terminal is equal to one-half the number of tracks N (N/2) and the number of lateral tracks passing on the other side of this said end terminal is equal to one-half of the number of terminals N minus one ((N−1)/2);
the terminals of a first group are offset by one pitch relative to the terminals of an adjacent second group along each direction of the matrix; and
an offset along said first direction is such that a number of lateral tracks equal to the number of terminals N minus one (N−1) pass between the end terminals located on the side of the edge of the matrix and a number of lateral tracks equal to the number of terminals N minus two (N−2) pass between the end terminal of one group and the second terminal of the other group, which are adjacent along a second direction of the matrix.

10. The electrical connection board according to claim 9, wherein N=4 such that:
the central track is connected to a first terminal, one lateral track passing on one side of and next to the first terminal is connected to a second terminal, and two other lateral tracks passing on either side of the first terminal are connected respectively to a third and a fourth terminal; and
the offset along the first direction is such that three lateral tracks pass between the end terminals located on the side of the edge of the matrix and two lateral tracks pass between the end terminal of one group and the second terminal of the other group, which are adjacent along the second direction of the matrix.

11. An electrical connection board comprising:
a plurality of electrical connection terminals on one face of the board for connection to a semiconductor component, wherein the terminals are positioned at selected intersection points in a matrix having two orthogonal directions;
a plurality of electrical connection tracks connected respectively to these terminals;
wherein the electrical connection terminals are divided into a plurality of connection groups, each connection group including N adjacent terminals aligned along a first one of the orthogonal directions which is perpendicular to an edge of the board;
wherein N electrical connection tracks connect to the N adjacent terminals and extend parallel to the first orthogonal direction towards the edge of the board; and
wherein a first of the connection groups is diagonally offset from a second of the connection groups by one intersection point in both of the two orthogonal directions.

12. The electrical connection board of claim 11 wherein a third of the connection groups is diagonally offset from the second of the connection groups by one intersection point in both of the two orthogonal directions, such that the first, second and third groups form a V- shape.

13. The electrical connection board of claim 12 wherein a point of the V-shape points in the first orthogonal direction towards the edge of the board.

14. The electrical connection board of claim 12 wherein a point of the V-shape points in the first orthogonal direction away from the edge of the board.

15. The electrical connection board of claim 12 wherein a fourth of the connection groups is diagonally offset from the first of the connection groups by one intersection point in both of the two orthogonal directions, wherein a fifth of the connection groups is diagonally offset from the third of the connection groups by one intersection point in both of the two orthogonal directions, such that the first through fifth groups form the V-shape.

16. The electrical connection board of claim 11 wherein if N is an even number, then the number of tracks for each group passing on one side of an end-most terminal nearest the edge is equal to one-half the number of tracks N (N/2) and the number of tracks passing on the other side of this said end-most terminal is equal to one-half of the number of terminals N minus one ((N−1)/2).

17. The electrical connection board of claim 16 wherein N equals 4.

18. The electrical connection board of claim 11 wherein if N is an odd number, then the number of tracks for each group passing on each side of an end-most terminal is equal to one-half of the number of terminals N minus one ((N−1)/2).

19. The electrical connection board of claim 18 wherein N equals either 3 or 5.

* * * * *